United States Patent [19]

Funabashi

[11] 4,070,628

[45] Jan. 24, 1978

[54] RADIO RECEIVER WITH SELECTIVE PLURAL BAND RECEPTION

[75] Inventor: Toshihisa Funabashi, Yokohama, Japan

[73] Assignee: Matsushita Electric Industrial Co., Ltd., Osaka, Japan

[21] Appl. No.: 667,563

[22] Filed: Mar. 17, 1976

[30] Foreign Application Priority Data

Mar. 20, 1975 Japan .................................. 50-34141

[51] Int. Cl.² ............................................. H04B 1/16
[52] U.S. Cl. ................................... 325/316; 325/461; 329/1
[58] Field of Search ................................ 325/315–317, 325/458, 461, 462; 343/205; 329/1, 146, 147

[56] References Cited

U.S. PATENT DOCUMENTS

| | | | |
|---|---|---|---|
| 2,487,772 | 11/1949 | Nicholson, Jr. et al. | 325/316 |
| 3,679,979 | 7/1972 | Krepps, Jr. et al. | 325/315 |
| 3,704,424 | 11/1972 | Fiore et al. | 325/458 |
| 3,743,943 | 7/1973 | Mason et al. | 325/316 |
| 3,878,467 | 4/1975 | Manson | 325/316 |

Primary Examiner—Robert L. Griffin
Assistant Examiner—Marc E. Bookbinder
Attorney, Agent, or Firm—Burgess, Ryan and Wayne

[57] ABSTRACT

A radio receiver consisting of a radio receiver circuit capable of the reception of one band such as the AM band and one or more adapters capable of the reception of other bands such as the FM band, the radio receiver circuit and the adapter housed in the same cabinet. Each adapter includes components such as a tuner, a detector and so on required for the reception of a desired band, and the output from a radio oscillator in the radio receiver circuit is converted into a voltage signal in response to which the tuning is carried out in the adapter. The number of reception bands may be increased in a simple manner depending upon the demand of the listener, and various operation control means such as a preset mechanism, a volume control and so on may be used in common among various adapters.

4 Claims, 7 Drawing Figures

RADIO RECEIVER WITH SELECTIVE PLURAL BAND RECEPTION

BACKGROUND OF THE INVENTION

The present invention relates to a radio receiver whose reception bands may be increased in a simple manner depending upon the demand of a listener.

There has been a strong demand for radio receivers whose reception bands may be increased depending upon the demand of a listener. For this demand, there has been devised and demonstrated an AM-FM radio receiver of the type which functions as an AM radio receiver when the output terminal of an antenna and the input terminal of an AM radio tuner are short-circuited by short-circuiting means such as a terminal board, but functions as an FM radio receiver when the output terminal of the antenna and the input terminal of the AM radio tuner are connected to an adapter consisting of an AM-FM changeover switch, an FM tuner, an oscillator and an FM-AM converter and when the AM-FM changeover switch is switched to the FM reception position.

The adapter is provided as a discrete unit; that is, it is not housed within the same cabinet of an AM radio receiver, and an AM tuning dial is attached on the AM radio receiver while an FM tuning dial is attached on the FM-AM adapter so that the operation is very inconvenient.

BACKGROUND OF THE INVENTION

In view of the above, one of the objects of the present invention is to provide a radio receiver in which a desired adapter may be mounted in the same cabinet with the radio receiver and operatively connected in a simple manner to the radio receiver circuit.

Another object of the present invention is to provide a radio receiver in which the output from a radio or local oscillator for a specific band such as the AM band may be converted into a suitable signal such as a voltage signal for tuning to the desired signal of the reception band of an adapter so that any desired broadcast signals in the reception bands of various adapters may be tuned in the same manner.

A further object of the present invention is to provide a radio receiver which may be manufactured at less cost, because even when the number of reception bands is increased, a substantial part of components of various types of adapters may be fabricated and assembled through common manufacturing steps.

To the above and other ends, the present invention provides a radio receiver comprising a cabinet in which is housed a radio receiver circuit consisting of at least a radio-frequency amplifier, a radio oscillator and an audio-frequency amplifier for the reception of a specific band, means responsive to the frequency derived from the radio oscillator for effecting the frequency sweeping of another band and applying its output the audio-frequency amplifier, and changeover switching means for selectively connecting the another-band-reception means to the radio receiver circuit.

DESCRIPTION OF THE PREFERRED EMBODIMENT

Figure 1:
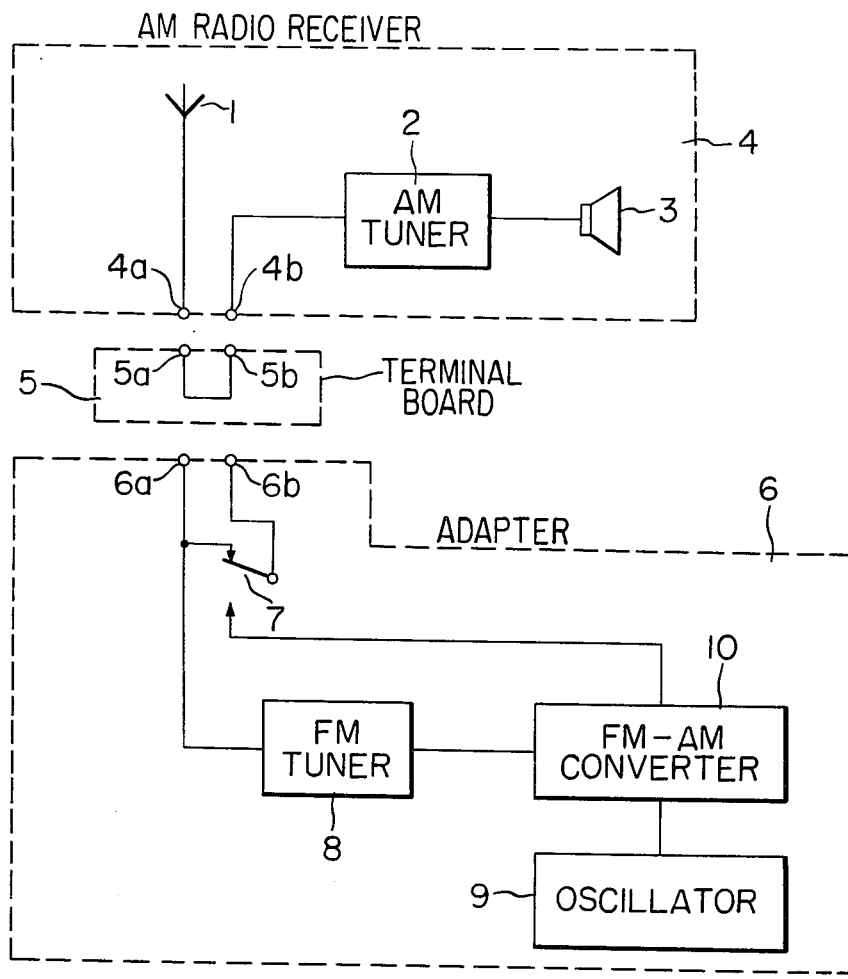
FIG. 1 is a block diagram of a prior art radio receiver.
Figure 2:
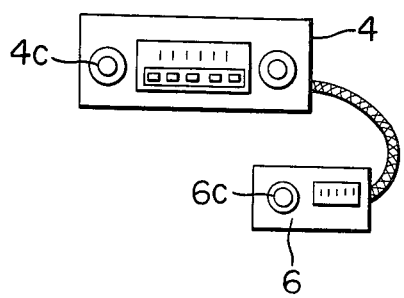
FIG. 2 is a schematic front view thereof.

Prior Art, FIGS. 1 and 2

Prior to the description of the preferred embodiment of the present invention, a prior art radio receiver with an adapter will be described briefly to specifically point out the problems thereof which the present invention contemplates to overcome. The prior art radio receiver shown in FIGS. 1 and 2 comprises an AM radio receiver 4 consisting of an antenna 1, an AM tuner 2, and a speaker 3; a terminal board 5; and an adapter 6 consisting of an AM-FM changeover switch 7, an FM tuner 8, an oscillator 9, and an FM-AM converter 10. For reception of the AM signal, a contact 4a of the antenna 1 is connected to a contact 4b of the AM tuner 2 while contacts 5a and 5b of the contact board 5 are interconnected. For reception of both AM and FM signals, the contacts 4a and 4b are made into contact with contacts 6a and 6b, respectively, of the adapter 6 instead of the contacts 5a and 5b. For the reception of the AM signal, the AM-FM changeover switch 7 is switched to the position shown in FIG. 1 so as to transmit the signal from the antenna 1 to the AM tuner 2. On the other hand, for the reception of FM signal the AM-FM changeover switch 7 is switched to connect the contact 6b to the FM-AM converter 10 so that the received FM signal may be converted into the AM signal to be reproduced by the AM radio receiver unit 4.

As shown in FIG. 2, the adapter 6 is provided as a discrete unit separated from the receiver unit 4, and an AM tuning dial 4c is attached on the AM radio receiver unit 4 while an FM tuning dial is, on the adapter 6 so that the tuning operation is very inconvenient.

The Invention, FIGS. 3 through 7

Figure 3:
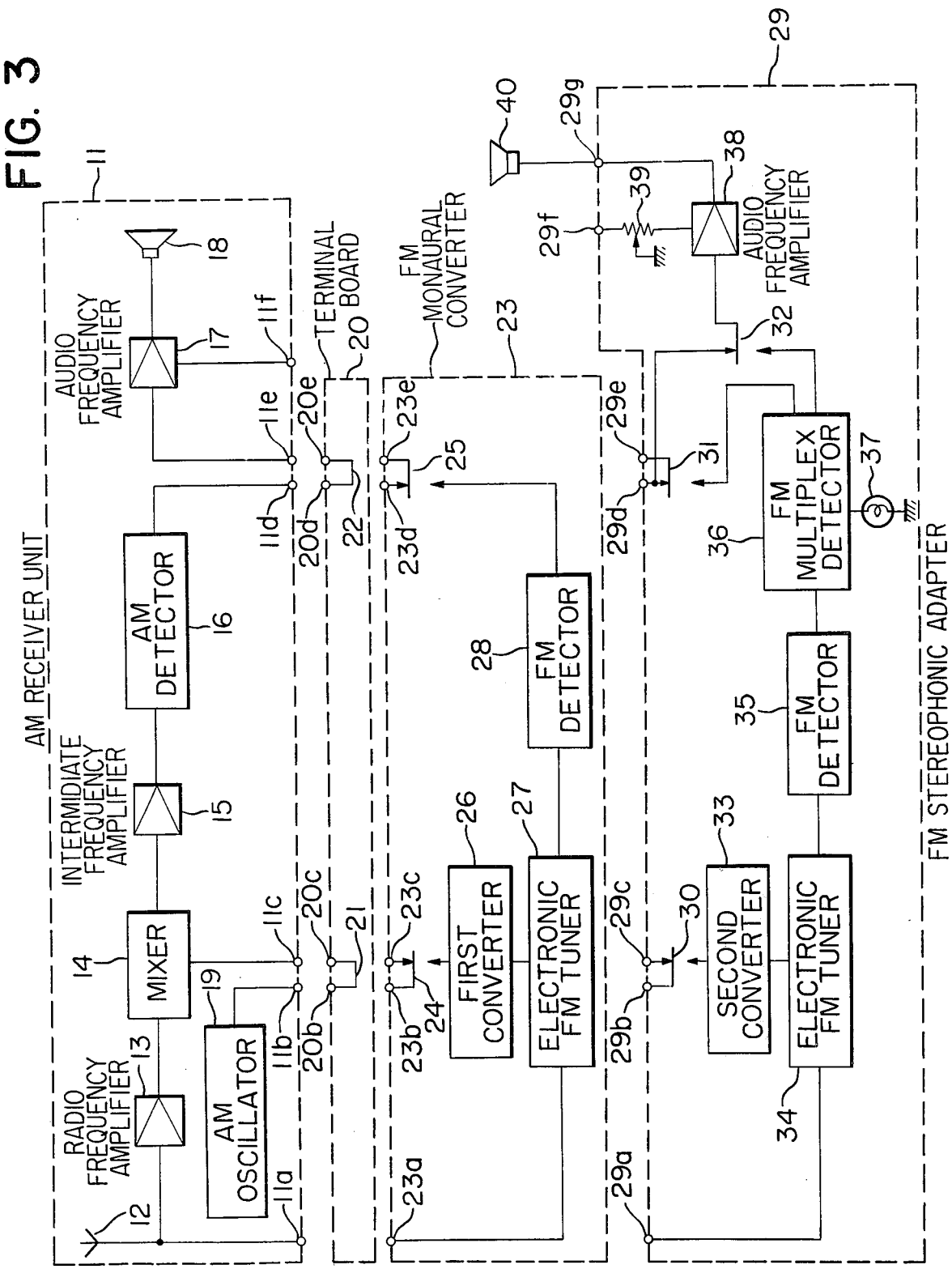
FIG. 3 is a block diagram of a preferred embodiment of a radio receiver in accordance with the present invention.

Referring first to FIG. 3, the preferred embodiment of the present invention comprises, in general, an AM receiver unit generally indicated by 11, a terminal board 20, an FM monaural converter generally indicated by 23 and an FM stereophonic converter generally indicated by 29. The AM receiver unit 11 comprises an antenna 12, a RF (Radio Frequency) amplifier 13, a mixer 14, and IF (Intermediate Frequency) amplifier 15, an AM detector 16, an AF (Audio Frequency) amplifier 17, a speaker 18 and an AM oscillator 19. The AM receiver unit 11 has an antenna terminal 11a, an AM oscillator terminal 11b, a mixer terminal 11c, an AM detector terminal 11d, and AF amplifier terminals 11e and 11f.

The terminal board 20 has a first short-circuiting means 21 for short-circuiting between terminals 20b and 20c and a second short-circuiting means 22 for short-circuiting between terminals 20d and 20e.

The FM monaural or monophonic converter 23 comprises AM-FM changeover switches 24 and 25 a first converter 26 for converting the frequency of the output from the AM oscillator 19 in the AM receiver unit 11 into a voltage, an electronic FM tuner 27 responsive to the output from the first converter 26 for sweeping an FM frequency band, and an FM detector 28. The FM monaural adapter 23 has a terminal 23a for connection with the antenna 12 and terminals 23b, 23c, 23d and 23e connected to the AM-FM changeover switches 24 and 25.

The FM stereophonic adapter 29 comprises AM-FM changeover switches 30, 31 and 32, a second converter 33 corresponding to the first converter 26, the FM tuner 27 and the FM detector 28 of the FM monaural adapter 23, an FM detector 35, an FM multiplex detector 36, an FM reception display means 37, an AF amplifier 38 and a balance resistor 39. The FM stereophonic adapter 29 has a terminal 29a for connection to the antenna 12, terminals 29b, 29c, 29d and 29e connected to the AM-FM changeover switches 30 and 31, a terminal 29f for connection with the terminal 11f of the AM receiver unit 11 and a terminal 29g for connection with an external speaker 40.

Figure 4A:
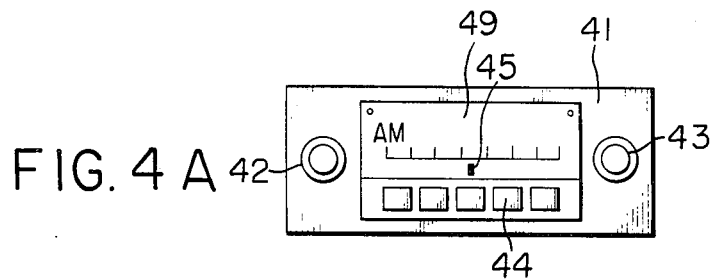
FIGS. 4(A), (B) and (C) are front views of the radio receivers with a terminal board, an FM monophonic adapter and an FM stereophonic adapter, respectively.
Figure 4B:
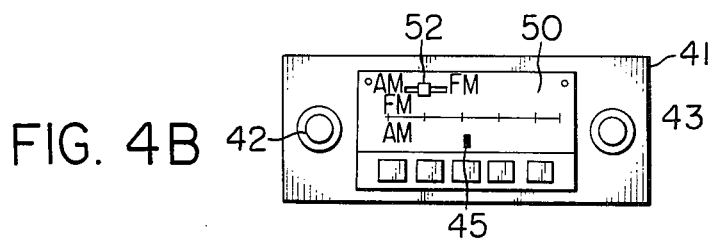
Figure 4C:
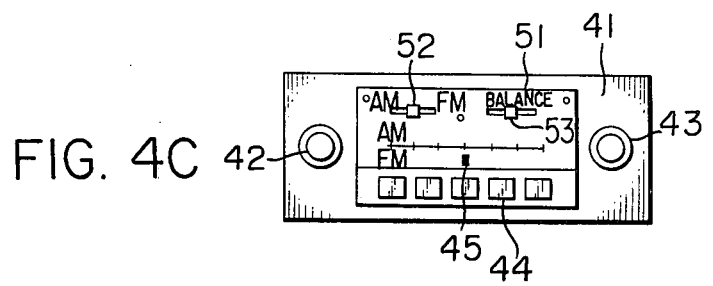
Figure 5A:
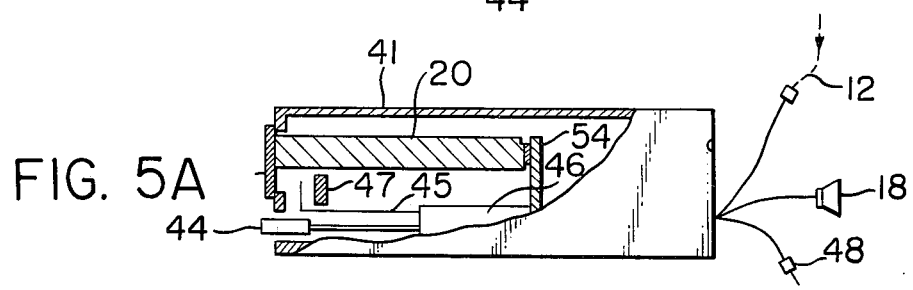
FIGS. 5(A), (B) and (C) are side views thereof with the side wall of the cabinet partly broken to show some components in the cabinet.
Figure 5B:
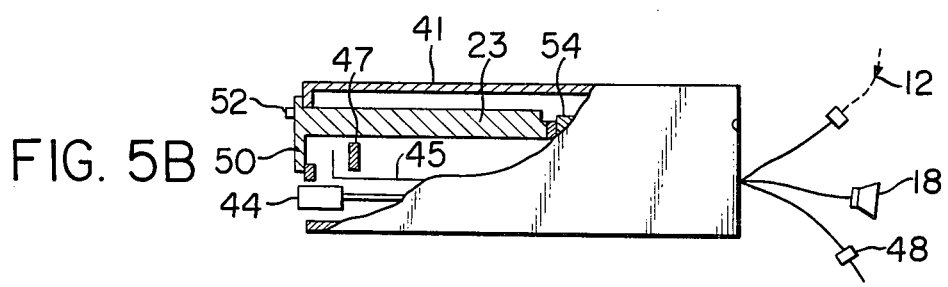
Figure 5C:
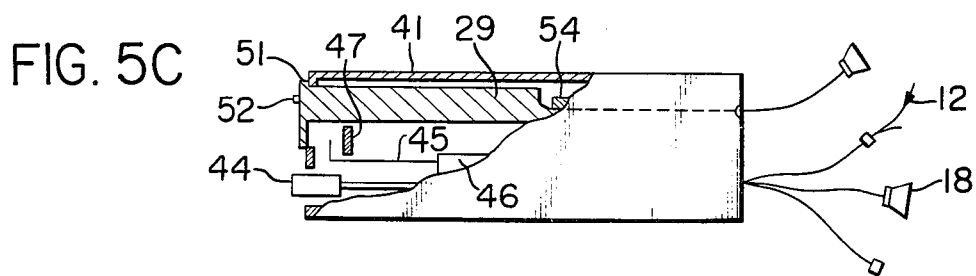
Figure 6:
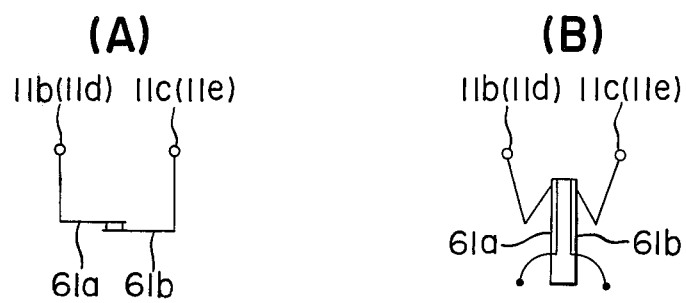
FIG. 6 shows a modification of terminal connections between the AM radio receiver circuit and an FM adapter.

FIGS. 4A – 4C and 5A – 5C show front and partially cutaway side views respectively of the radio receivers incorporating the above AM receiver unit 11 in conjunction with the terminal board 20, the FM monaural adapter 23 and the FM stereophonic adapter 29, respectively. FIGS. 4(A) and 5(A) show that the AM receiver unit 11 is connected to the terminal board 20; FIGS. 4(B) and 5(B) show that the AM receiver unit 11 is connected to the FM monaural adapter 23; and FIGS. 4(C) and 5(C) show that the AM receiver unit 11 is connected to the FM stereophonic adapter 29, all of said connections being made via the terminal board 54 containing terminals 11a through 11f of the AM receiver 11 (see FIG. 3). The remaining portions of the receiver 11 are mounted within the cabinet 41 and are omitted in FIGS. 4A – 4C and 5A – 5C for purposes of clarity.

Still referring to FIGS. 4 and 5, reference numeral 41 denotes a cabinet; 42, an ON-OFF switch - volume control knob; 43, a manual tuning dial; 44, pushbottons (corresponding to pre-set pushbuttons of a car radio), 45, a pointer; 46, a tuner including the AM oscillator 19 shown in FIG. 3; 47, a backing plate; 48, a plug for connection with a power supply; 49, 50 and 51, escutcheons; 52, an AM-FM changeover switch knob operatively coupled to the AM-FM changeover switches 24, 25, 30, 31 and 32; 53, a balance adjusting knob; and 54, a terminal board upon which are mounted the terminals 11a through 11f of the AM receiver unit 11.

Figure 7:
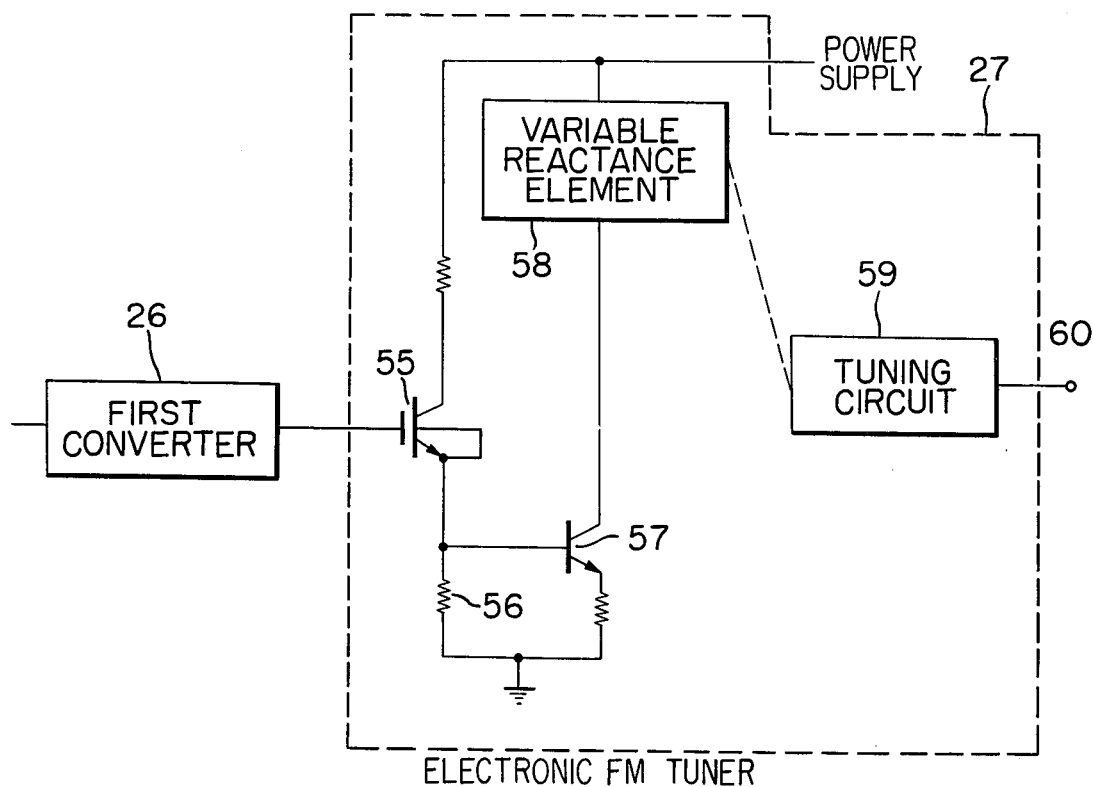
FIG. 7 is a circuit diagram of an FM tuner.

FIG. 7 is a block diagram of the FM tuner 27 of the FM monaural adapter 23, comprising a field-effect transistor 55 whose source current changes in response to the output from the first converter 26, a source resistor 56, a transistor 57 for amplifying the output voltage across the source resistor 56, a variable reactance element 58 which is connected to a tuning circuit 59 and whose reactance changes in response to the magnitude of current flowing therethrough, and an output terminal 60.

In the FM tuner 27 with the above construction, the source current of the field-effect transistor 55 changes in response to the output from the first converter 26, and the collector current of the transistor 57 changes in response to the output voltage across the source resistor 56 of the field-effect transistor 55 so that the variable reactance element 58 changes its reactance in response to the collector current of the transistor 57 and consequently the tuning frequency of the tuning circuit connected to the antenna 12 changes. That is, the tuning frequency changes in response to the output of the first converter 26.

Next referring back to FIG. 3, the mode of operation of the preferred embodiment will be described. When the terminals 11b through 11e of the AM receiver unit 11 are connected to the corresponding terminals 20b through 20e of the terminal board 20, the AM receiver unit 11 functions as an AM radio receiver as with the case of the prior art radio receiver shown in FIG. 1.

When the AM receiver unit 11 is connected to the FM monaural adapter 23 and when the AM-FM changeover switches 25 and 24 are in the position shown in FIG. 3, the AM receiver unit 11 also functions as an AM radio receiver. When the AM-FM changeover switches 25 and 24 are switched to connect the terminals 23b and 23e to the first converter 26 and the FM detector 28, respectively, the FM monaural receiver circuit is established consisting of the antenna 12, the AM oscillator 19, the converter 26, the FM tuner 27, the FM detector 28, the AF amplifier 17 and the speaker 18 so that the monaural FM output signal may be reproduced. Since the FM tuner 27 is of the electronic type as described above, the voltage derived from the converter 26 is dependent upon the frequency output from the oscillator 19 in the AM receiver unit 11, and the frequency sweeping by the FM tuner 27 is controlled in response to the output voltage from the converter 26 so that the desired FM signal may be tuned. Therefore, when the frequency derived from the oscillator 19 changes, the voltage derived from the converter 26 changes accordingly and consequently the tuned frequency changes. Therefore, when the frequency derived from the oscillator 19 changes continuously, the continous frequency sweeping is carried out.

When the FM stereophonic adapter 29 is connected to the AM receiver unit 11 and the external speaker 40 and when the AM-FM changeover switches 30, 31 and 32 are in the position shown in FIG. 3, the AM signal may be received. When the AM-FM changeover switches 30, 31 and 32 are switched to close the contacts which are shown opened in FIG. 3, the FM stereo output may be reproduced. If the external speaker 40 is not connected to the FM stereophonic adapter, the FM monaural output is reproduced.

Since the AM receiver unit 11 and (i) the terminal board 20, (ii) the FM monaural adapter 23 or (iii) the FM stereophonic adapter 29 are arranged in the same cabinet as shown in FIGS. 4A – 4C and 5A – 5C, the AM receiver unit 11 may be selectively connected to the terminal board 20, FM monaural adapter 23 or FM stereophonic adapter 29 so that the AM broadcast reception, FM monaural broadcast reception or FM stereophonic bradcast reception may be made.

It will be readily understood by those skilled in the art that the radio receiver in the fundamental form as shown in FIGS. 4 and 5 may readily converted into a multiband receiver when the AM receiver unit 11 is connected to any other suitable adapters capable of receiving the signals in other bands than the AM and FM bands.

As described above, the electronic tuners 27 and 34 operate in response to the frequency derived from the oscillator 19 in the AM receiver unit 11 so that even when the number of bands to be received is increased, one oscillator suffices. In other words, the mechanical preset mechanism in the AM receiver unit 11 may be used in common with any adapters.

So far the terminal board 20 has been described as being used to short-circuit between the terminals 11b and 11c and between the terminals 11d and 11e of the AM receiver unit 11 so that the latter may function as an AM radio receiver, but it will be understood that, as shown in FIG. 6(A), the terminals 11b and 11c (or 11d and 11e) may be normally short-circuited through contacts 61a and 61b and may be made out of contact from each other when a terminal plate 62 attached to the adapter 23 or 29 is inserted between the contacts 61a and 61b as shown in FIG. 6(B). When the terminal plate 62 is inserted, the contacts 61a and 61b are made into contact with conductor layers 63a and 63b on the opposite surfaces of the terminal plate 62. This arrangement has an advantage that the terminal board 20 may be eliminated.

When the radio receiver in accordance with the present invention is used as a car radio, the dimensions of the radio receiver 41 (See FIG. 4) are very critical and dependent upon the size of the tuner 46 (See FIG. 5). At present, owing to the research and development of tuners, the thickness of the tuner 46 may be reduced to one-half to one-third as compared with the prior art tuners. Therefore, the FM adapters 23 and 29 may be so designed as to have an overall thickness equal to one-half to one-third of the height of the cabinet 41.

As described above, the AM receiver unit 11 may be used in common with any adapters such as FM adapters 23 and 29 so that the steps required for assembly of the radio receivers may be reduced in number and consequently the considerable cost reduction may be attained.

What is claimed is:

1. A radio receiver for providing AM reception and capable of accommodating an FM adapter, said adapter comprising a modular unit having (i) first and second sets of changeover contacts adjacent a surface thereof, (ii) an FM frequency scale, (iii) a frequency to voltage converter having an input terminal coupled to a contact of said first set, (iv) a voltage controllable electronic FM tuner having an input terminal coupled to an output terminal of said converter and controlled thereby, (v) means for coupling an input terminal of said tuner to an antenna terminal of said receiver, (vi) an FM detector having an input terminal coupled to an output terminal of said tuner, and (vii) means for coupling an output terminal of said detector to a contact of said second set, said receiver comprising:

a cabinet;
an AM radio receiver circuit disposed within said cabinet, said circuit comprising:
a manually operable tuning control;
an AM variable frequency oscillator coupled to said control and operated thereby;
an AM antenna terminal;
a mixer coupled to said AM antenna terminal;
a terminal board having third and fourth contacts coupled to an output terminal of said oscillator and an input terminal of mixer respectively;
AM amplification and detection means coupled to an output terminal of said mixer;
a speaker;
fifth and sixth contacts on said terminal board coupled to an output terminal of said AM amplification and detection means and to said speaker respectively;
said cabinet having a space therein for accommodating said FM adapter in a selectively removable manner so that when said adapter is installed therein (A) the first set of contacts of said adapter engages the third and fourth contacts of said terminal board to couple the output terminal of said AM oscillator to the input terminal of said converter to vary the frequency of said FM tuner in response to operation of said tuning control, and (B) the second set of contacts of said adapter engages the fifth and sixth contacts of said terminal board to couple the output terminal of said FM detector to said speaker,
said adapter further including switch means for interconnecting said (i) third and fourth and (ii) fifth and sixth contacts respectively when AM radio operation is desired, said space also being capable of accommodating a member for interconnecting said (i) third and fourth and (ii) fifth and sixth contacts respectively when said adapter is absent and AM radio operation is desired.

2. A radio receiver comprising:
a cabinet containing a radio receiver circuit capable of receiving a first band of frequencies and including a tunable oscillator and a speaker;
a series of contacts coupled to said receiver for coupling said oscillator and speaker to an adapter capable of receiving a second band of frequencies,
said adapter having frequency sensitive tuning means and a detection circuit;
said cabinet having means for accommodating said adapter in selectively removable fashion such that, when said adapter is installed, said tuning means is coupled to said oscillator via one or more of said contacts and controlled thereby, and said detection circuit is coupled to said speaker via one or more of said contacts.

3. The radio receiver according to claim 2, further comprising means associated with said adapter and coupled to one or more of said contacts for selectively disabling said radio receiver circuit when reception of said first band of frequencies is not desired, and for rendering said circuit operational when such reception is desired.

4. A radio receiver, comprising:
a cabinet containing AM radio receiver circuit elements comprising an antenna, an AM oscillator, a mixer an AM detector connected to said mixer, an audio frequency amplifier and a speaker connected to said amplifier, said circuit elements having a first terminal connected to said antenna and said mixer, a second terminal connected between an output terminal of said AM oscillator, a third terminal connected to a local oscillator signal input terminal of said mixer, a fourth terminal connected to an output of said AM detector, and a fifth terminal connected to an input terminal of said audio frequency amplifier, whereby said AM radio receiver circuit elements may be used as an AM radio by connecting thereto a terminal adapter having a first short-circuiting means for short-circuiting between said second and third terminals and a second short-circuiting means for short-circuiting between said fourth and fifth terminals, or may be used as an FM radio by connecting an FM monaural converter thereto, comprising AM-FM changeover means connected between said second and third terminals and said fourth and fifth terminals, a first converter, an electronic FM tuner and an FM detector coupled to said FM tuner whereby said converter is coupled to said AM oscillator for providing a tuning signal for said FM tuner and said FM detector is coupled to said fifthe terminal.

* * * * *